US006374379B1

(12) United States Patent
Walker et al.

(10) Patent No.: US 6,374,379 B1
(45) Date of Patent: Apr. 16, 2002

(54) LOW-COST CONFIGURATION FOR MONITORING AND CONTROLLING PARAMETRIC MEASUREMENT UNITS IN AUTOMATIC TEST EQUIPMENT

(75) Inventors: Ernest P. Walker, Weston; Ronald A. Sartschev, Dunstable; Allan M. Ryan, Jr., Billerica; Eric D. Blom, Wakefield, all of MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/245,519

(22) Filed: Feb. 5, 1999

(51) Int. Cl.$^7$ ............................................... G01R 31/28
(52) U.S. Cl. ...................................... 714/724; 324/763
(58) Field of Search ............................. 714/724, 736; 324/73–1, 76–11, 158–1, 763, 765, 522; 702/119–121

(56) References Cited

U.S. PATENT DOCUMENTS

| | | | |
|---|---|---|---|
| 4,348,759 A | * 9/1982 | Schnurmann | 714/724 |
| 4,626,769 A | 12/1986 | Valley et al. | 323/283 |
| 4,646,299 A | 2/1987 | Schinabeck et al. | 714/736 |
| 4,656,632 A | * 4/1987 | Jackson | 714/736 |
| 4,724,378 A | * 2/1988 | Murray et al. | 324/73.1 |
| 4,807,161 A | * 2/1989 | Comfort et al. | 702/120 |
| 4,816,750 A | * 3/1989 | Van der Kloot et al. | 324/73.1 |
| 4,862,069 A | * 8/1989 | Albee | 324/73.1 |
| 5,107,427 A | 4/1992 | Peter et al. | 701/34 |
| 5,235,273 A | 8/1993 | Akar et al. | 714/724 |
| 5,461,310 A | * 10/1995 | Cheung et al. | 324/158.1 |
| 5,512,895 A | 4/1996 | Madden et al. | 341/61 |
| 5,652,524 A | * 7/1997 | Jennion et al. | 324/765 |
| 6,101,458 A | * 8/2000 | Sugasawara et al. | 702/119 |
| 6,138,257 A | * 10/2000 | Wada et al. | 714/724 |
| 6,154,715 A | * 11/2000 | Dinteman | 702/120 |

FOREIGN PATENT DOCUMENTS

| WO | 99/17179 | 4/1999 | G05F/1/10 |
|---|---|---|---|

OTHER PUBLICATIONS

Sheehan G. et al: "A 7–Channel Level Generator Chip for a VLSI Digital Tester", Proceedings of the Custom Integrated Circuits Conference, U.S., New York, IEEE, vol. Conf. 12, 1990, pp. 651–654, XP000167811.

Hamling, Automatic Biploar ASIC Wafer Testing Up to 5 Ghz, IEEE, pp. 271–274, 1989.*

* cited by examiner

*Primary Examiner*—Christine T. Tu
*Assistant Examiner*—Shelly A Chase
(74) *Attorney, Agent, or Firm*—Edmund J. Walsh

(57) ABSTRACT

Pin slice circuitry used in automatic test equipment is disclosed. The pin slice circuitry includes a portion implemented using CMOS technology and a portion implemented using bipolar technology. The CMOS portion includes a plurality of timing generator circuits, digital sigma delta modulator circuitry used to generate digital bit streams representative of analog reference levels, and programmable digital signal processing circuitry. The bipolar portion includes driver/receiver channels, a parametric measurement unit, and decoder circuitry, which produces the analog reference levels from the digital bit streams generated by the modulator circuitry. The analog reference levels are used by the driver/receiver channels and the parametric measurement unit; and, the digital signal processing circuitry is used to monitor and control levels produced by the parametric measurement unit. The disclosed pin slice circuitry has the advantages of reduced size and cost as compared with conventional pin slice circuitry.

19 Claims, 7 Drawing Sheets

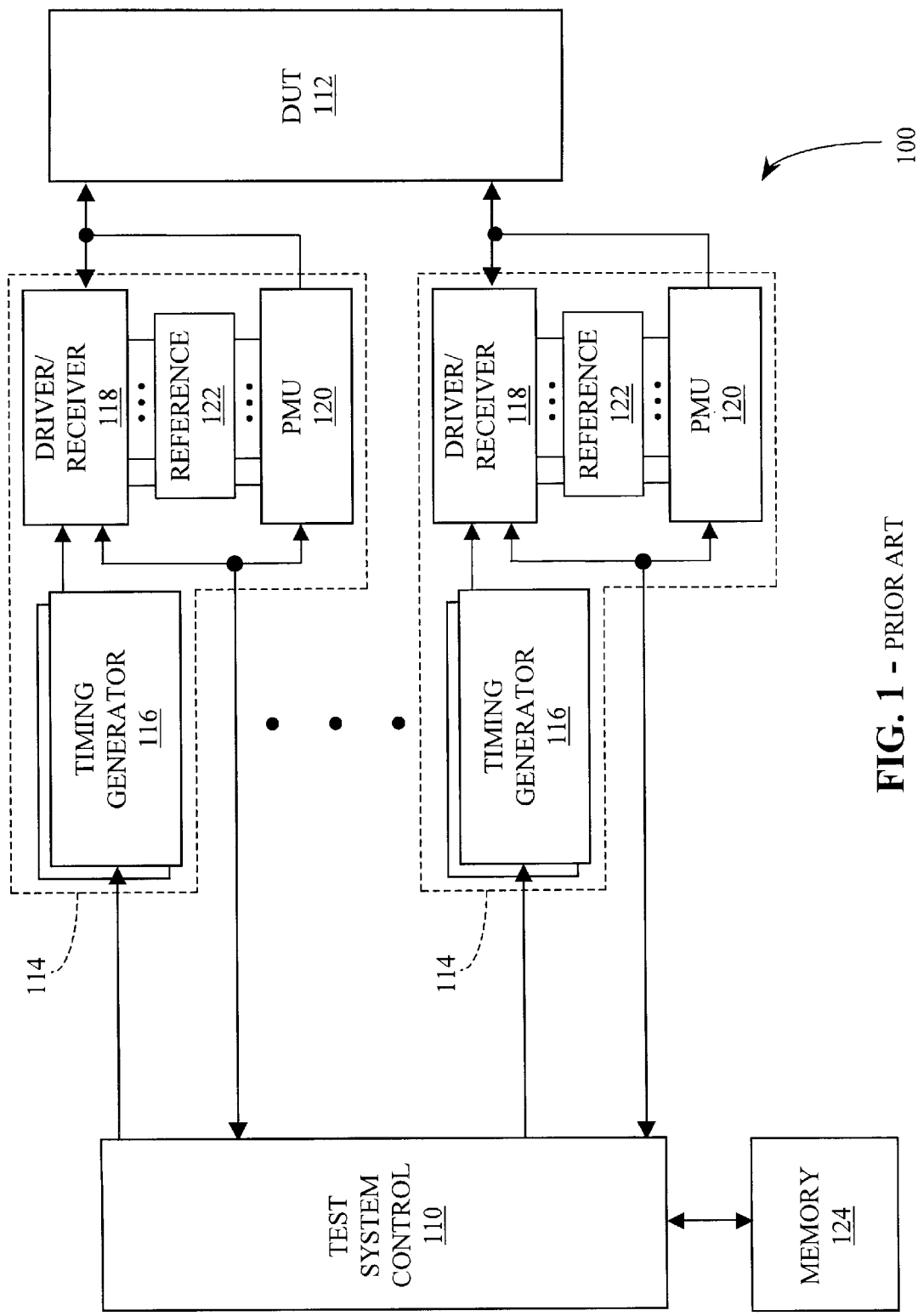
FIG. 1 - PRIOR ART

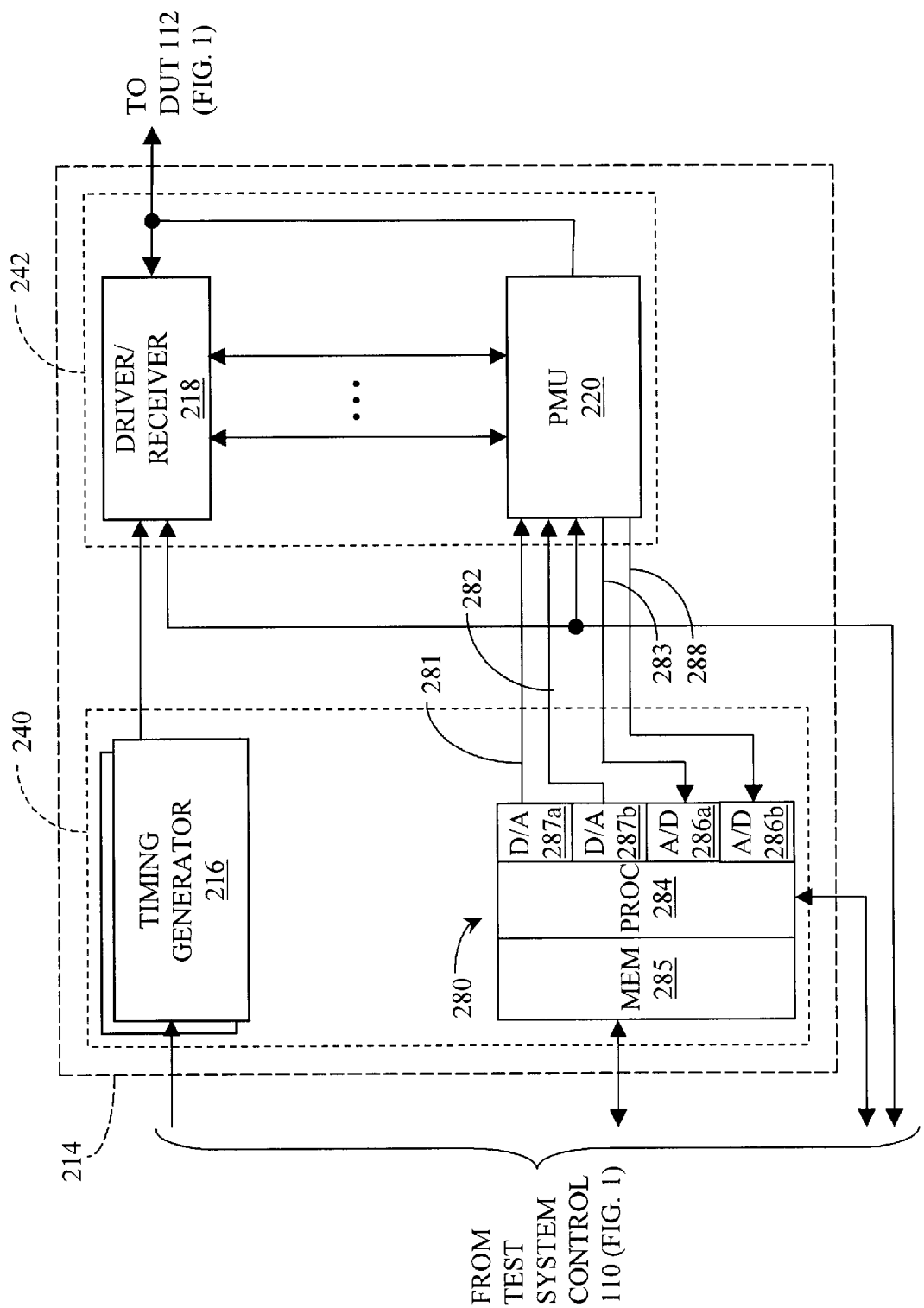

LOW-COST CONFIGURATION FOR MONITORING AND CONTROLLING PARAMETRIC MEASUREMENT UNITS IN AUTOMATIC TEST EQUIPMENT

This invention relates generally to automatic test equipment, and more specifically to the use of programmable digital devices for monitoring and controlling parametric measurement units in automatic test equipment.

Automatic test equipment (also known as a "tester") is widely used to test semiconductor devices, printed circuit boards, and other electronic components and assemblies. Many testers, especially those that are used to test semiconductor devices, use "pin slice" architecture. Such testers generally include multiple pin slice circuits, each associated with a separate pin on a device under test (DUT). Further, each pin slice circuit generally includes circuitry for generating and measuring signals at its associated pin on the DUT.

A typical tester may generate and measure signals on hundreds to a few thousand pins, each pin having its own pin slice circuitry. This means that pin slice circuitry is duplicated hundreds or thousands of times in a tester. It is therefore very important for testers to use pin slice circuits that are both area and cost efficient.

In addition, during a typical test session, it is often necessary to vary one or several analog reference voltage levels used in each pin slice circuit. This is especially the case when performing parametric tests of a DUT's drive and receive levels.

For example, a sequence of reference voltage levels may be generated and provided to certain sections of the pin slice circuits. If the steps of generating and providing changes in the reference voltage levels require a large amount of time, then the time to complete the full test session could become very long, especially if the test session calls for the generation of sequences of hundreds of different reference voltage levels. It is therefore very important for testers to communicate the desired reference voltage level changes and generate new reference voltage levels quickly.

However, pin slice circuits must also generate and measure signals with a high degree of accuracy. This is because any inaccuracy in signal levels generated or measured by pin slice circuits will generally affect the accuracy of test results. In particular, it is very important for pin slice circuits to generate stable voltage and current levels during parametric tests. Further, pin slice circuits must generate and measure signals at levels that are compatible with the semiconductor devices being tested.

One way of satisfying these competing requirements is to design pin slice circuits using a combination of different component technologies. For example, pin slice circuits have been designed using a combination of CMOS and bipolar component technologies.

Primarily because of the low power requirements of CMOS components, CMOS has become the technology of choice for many designers of computers and electronic devices. Consequently, CMOS components have become widely available and relatively inexpensive. Further, because of the desire to make computers and electronic devices both faster and smaller, the dimensions of CMOS components have decreased significantly over the years. Accordingly, portions of pin slice circuits have been designed using CMOS technology in an effort to make the circuits lower cost and more compact.

However, one shortcoming of designing circuits using CMOS technology is that it can lead to unstable and unpredictable timing characteristics. For example, timing characteristics of identical CMOS circuits have been found to vary from component-to-component.

Further, timing characteristics of CMOS components have been found to vary with temperature. For example, as frequencies of signals processed by CMOS components increase, power requirements of the CMOS components also generally increase, thereby causing the components to heat-up. This increase in temperature can affect propagation delays through the CMOS components.

Generally, this shortcoming of CMOS technology does not seriously affect the performance of most computers and electronic devices because CMOS circuits in these devices are usually synchronized with an internal clock. Such synchronous design techniques are often used to enhance the stability and predictability of electronic circuits.

Although some portions of pin slice circuits can also be synchronized with a clock inside the tester, the timing of other portions of pin slice circuits cannot be similarly synchronized. For example, the times at which pin slice circuits generate and measure signals at pins of a DUT are usually determined by the DUT, not by a clock internal to the tester.

Accordingly, when CMOS technology is used to implement circuitry for generating timing signals in pin slice circuits, compensation techniques must generally be used to improve the timing characteristics of the CMOS circuitry. Such compensation techniques are described in U.S. patent application Ser. No. 08/510,079, assigned to TERADYNE®, Inc., Boston, Mass., USA.

Another reason why CMOS technology is sometimes not used to implement the signal generation portions of pin slice circuits is that CMOS circuits generally have low drive capabilities.

For these reasons, bipolar technology is often used for implementing signal generation and measurement portions of pin slice circuits in conventional testers. Timing characteristics of circuits made with bipolar technology are generally more stable and more predictable than CMOS circuits. Further, bipolar circuits can generally drive and measure signals at higher power levels than CMOS circuits.

Such a conventional tester 100 is shown in FIG. 1. The tester 100 includes a test system controller 110, which includes a special purpose computer (not shown); and, a memory 124, which stores test results and information needed to control the tester 100. Both the test system controller 110 and the memory 124 are normally implemented using CMOS technology. This is because the test system controller 110 and the memory 124 are typically synchronized with a test system clock. Further, neither the test system controller 110 nor the memory 124 is required to drive or receive signals with high power levels.

The tester 100 also includes multiple pin slice circuits 114, which generate and measure signals at separate pins of a DUT 112, which might be a discrete semiconductor device or one of a plurality of dies on a semiconductor wafer.

Each pin slice circuit 114 typically has portions that are implemented using either CMOS or bipolar technology. For example, the pin slice circuits 114 include timing generators 116, which may be implemented using CMOS technology. In this case, the compensation techniques mentioned above are typically used to improve timing characteristics of the CMOS circuits. The timing generators 116 produce timing signals in response to commands from the test system controller 110 for determining times at which driver/receiver channels 118 drive or measure digital signals at pins of the DUT 112.

The driver/receiver channels 118 in the pin slice circuits 114 are typically implemented using bipolar technology.

This ensures that the driver/receiver channels 118 have the capability of driving and measuring digital signals at pins of the DUT 112 at the proper times.

Two of the pieces of information that the test system controller 110 uses to control the pin slice circuits 114 indicate values of logical high and logical low levels to be provided by the driver/receiver channels 118 to the DUT 112; and, values of logical high and logical low levels to be received by the driver/receiver channels 118 from a properly functioning DUT 112.

In particular, the pin slice circuits 114 include reference voltages 122, which are typically implemented using discrete analog circuitry. The reference voltages 122 provide multiple reference voltages to the driver/receiver channels 118. Accordingly, the test system controller 110 provides information to the driver/receiver channels 118 indicating which reference voltages to use as logical high levels and logical low levels.

The pin slice circuits 114 also include parametric measurement units (PMU's) 120, which are typically implemented using bipolar technology and discrete analog circuitry. Whereas the driver/receiver channels 118 generate and measure digital signals, the PMU's 120 produce and measure DC levels.

The reference voltages 122 also provide multiple reference voltages to the PMU's 120. The test system controller 110 therefore provides information to the PMU's 120 indicating which reference voltages to use when producing and measuring DC levels at pins of the DUT 112.

Further, in order to generate stable voltage and current levels during parametric tests, the PMU's 120 typically include discrete analog circuitry (not shown) for providing feedback control of the voltage and current levels.

In a typical test configuration, only the driver/receiver channel 118 or the PMU 120 in a pin slice circuit 114 is active at one time. Accordingly, switches or relays (not shown) are normally used to keep the driver/receiver channels 118 and the PMU's 120 isolated from each other.

We have recognized that a significant part of the size and cost of a pin slice circuit is due to the discrete analog circuitry used in the circuit. Because a tester may include thousands of pin slice circuits, reducing the amount of discrete analog circuitry used could substantially affect the size and cost of the tester.

We have further recognized that another significant part of the size and cost of a pin slice circuit is attributable to the size of IC's used in the circuit.

It would therefore be desirable to have a tester with reduced size and cost that can successfully test electronic devices or assemblies. It would also be desirable to achieve reduced size and cost in a tester designed using pin slice architecture.

SUMMARY OF THE INVENTION

With the foregoing background in mind, it is an object of the invention to reduce both the size and cost of a tester.

Another object of the invention is to increase the amount of pin slice circuitry that is implemented using low-cost CMOS technology.

Still another object of the invention is to reduce the size of IC's used in the pin slice circuitry.

The foregoing and other objects are achieved by providing a tester with multiple pin slice circuits, each pin slice circuit including circuitry implemented using CMOS technology and circuitry implemented using bipolar technology. In a preferred embodiment, the CMOS circuitry includes multiple digital sigma delta modulators, each digital sigma delta modulator producing a bit stream representative of a sequence of analog reference voltage levels; and, the bipolar circuitry includes multiple digital sigma delta decoders, each digital sigma delta decoder receiving a bit stream from a respective digital sigma delta modulator and converting the bit stream into a sequence of analog reference voltage levels. Each sequence of analog reference voltage levels is then provided to circuitry such as a driver/receiver channel and/or a parametric measurement unit.

According to one feature, the digital sigma delta modulator circuitry includes circuitry for combining the multiple bit streams onto a limited number of lines. According to another feature of the invention, the digital sigma delta decoder circuitry includes circuitry for segregating the multiple bit streams from the limited number of lines.

In another embodiment, a serial bit stream is provided to an integrated circuit chip. Next, circuitry on the integrated circuit chip is used to segregate the serial bit stream into a plurality of segregated bit streams. The segregated bit streams are then used to generate analog reference levels for driver/receiver circuitry in the integrated circuit chip.

According to one feature, the integrated circuit chip is implemented using bipolar technology.

In still another embodiment, a semiconductor wafer is provided with a plurality of dies. Next, the dies are tested using driver/receiver circuitry implemented in an integrated circuit chip, thereby identifying good dies. The good dies are then packaged.

According to one feature, the driver/receiver circuitry is provided with reference levels produced from digital bit streams.

In yet another embodiment, the bipolar circuitry includes a parametric measurement unit, which generates and measures DC voltage and current levels; and, the CMOS circuitry includes a digital signal processing device, which monitors and controls the generation of the DC voltage and current levels.

According to one feature, the parametric measurement unit includes a low current section and a high current section, both of which are selectively monitored and controlled by the digital signal processing device.

According to another feature, reference levels used by the parametric measurement unit are provided by digital sigma delta modulators and digital sigma delta decoders.

In another embodiment, the reference levels used by the parametric measurement unit are provided by D-to-A converters controlled by the digital signal processing device.

According to still another feature, the digital signal processing device controls the low current section and the high current section of the parametric measurement unit by controlling inputs to the digital sigma delta modulators.

According to yet another feature, the digital signal processing device controls the low current section and the high current section of the parametric measurement unit by controlling inputs to drivers included in the parametric measurement unit.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a block diagram of a conventional tester using pin slice architecture;

FIG. 2B is a partial block diagram of a pin slice circuit according to another embodiment of the invention

DESCRIPTION OF THE PREFERRED EMBODIMENT

Figure 2A:
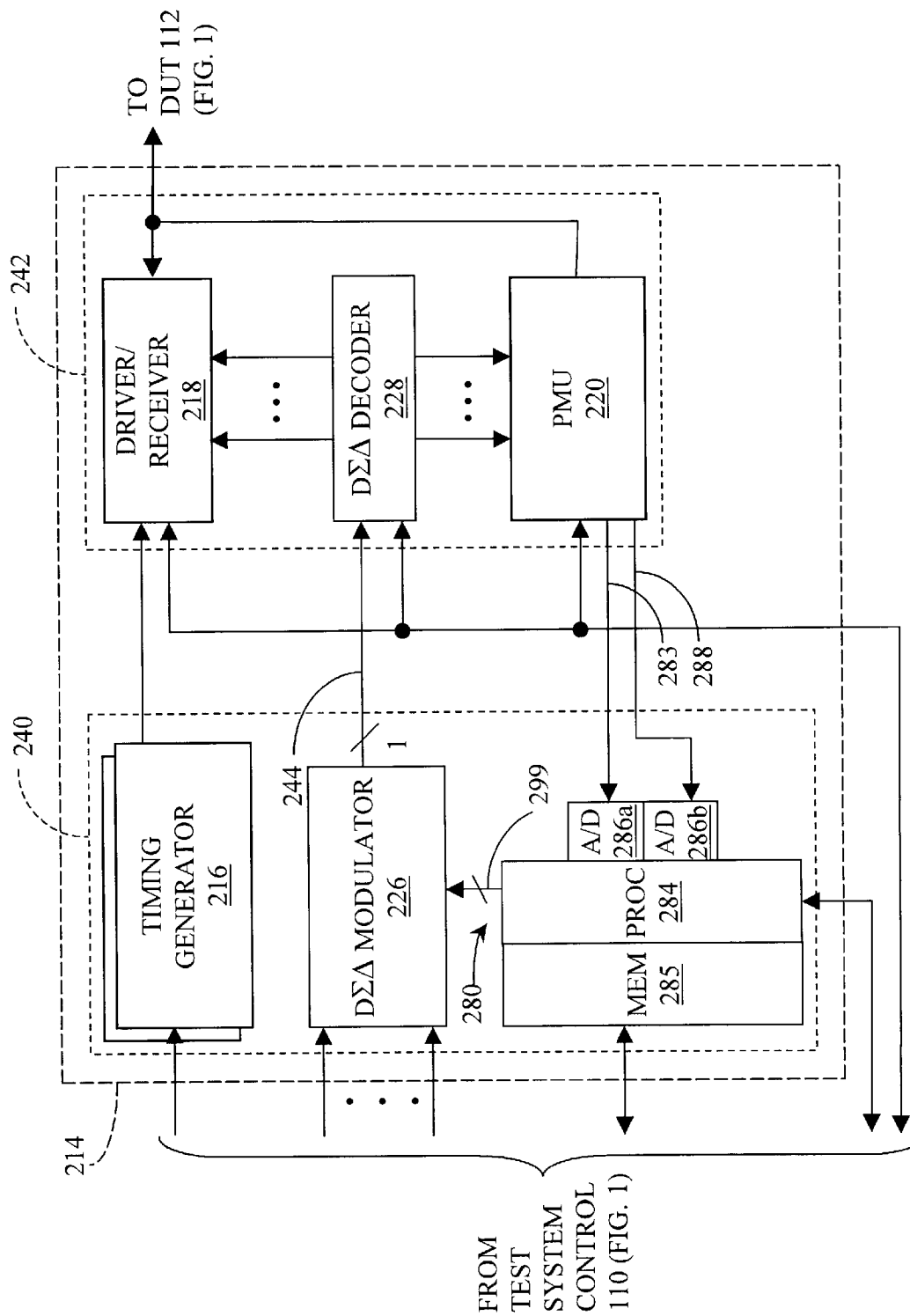
FIG. 2A is a partial block diagram of a pin slice circuit according to the invention.

FIG. 2A shows a partial block diagram of pin slice circuit 214 in accordance with the present invention. The pin slice circuit 214 is meant to be incorporated into a tester using pin slice architecture, such as the tester 100 shown in FIG. 1.

Accordingly, the pin slice circuit 214 would normally be replicated at least hundreds and likely thousands of times in a tester. Further, each replication of the pin slice circuit 214 would normally be used for generating and measuring signals and levels at a separate pin of a device under test (DUT), such as the DUT 112 shown in FIG. 1.

Because the pin slice circuit 214 is normally replicated many times in a tester, there is a strong economic incentive to reduce the size and cost of the pin slice circuit 214 as much as possible. However, the size and cost of the pin slice circuit 214 must be reduced in a way that does not adversely affect the accuracy of the signals generated and measured by the pin slice circuit 214.

For this reason, the pin slice circuit 214 is preferably implemented using a combination of circuit technologies. In particular, the pin slice circuit 214 includes a portion 240 implemented using CMOS technology and a portion 242 implemented using bipolar technology. Generally, circuitry implemented using CMOS technology can be made relatively compact, low cost, and low power. Further, circuitry implemented using bipolar technology generally has superior timing characteristics and drive capabilities. For example, emitter-coupled logic (ECL) provides the speed and drive required by most pin slice circuit applications. In this way, the size and cost of the pin slice circuit 214 can be reduced while maintaining a high level of accuracy in the generated and measured signals.

The CMOS portion 240 includes several copies of a timing generator 216, which generally produces a timing signal or "edge" a programmed amount of time after the start of a test cycle. There are several copies of the timing generator 216 because each one can be controlled by a test system controller (such as the test system controller 110 shown in FIG. 1) for performing a specific function.

For example, one timing generator can be controlled to start the generation of a test signal, while another timing generator can be controlled to stop the test signal generation. Similarly, still another timing generator can be controlled to start the measurement of a received signal, while yet another timing generator can be controlled to stop the signal measurement.

The CMOS portion 240 also includes digital sigma delta modulator (DΣΔM) circuitry 226, which is also controlled by the test system controller 110 and is preferably used for producing data relating to a series of reference voltages used by the pin slice circuit 214. A novel way of using the DΣΔM circuitry 226 to produce the reference voltages is described in detail below.

The CMOS portion 240 also includes a digital signal processing device 280, which includes a programmable digital signal processor 284, a read/write memory 285, and analog-to-digital converter (A-to-D) channels 286a and 286b. Functions performed by the digital signal processing device 280 include monitoring DC voltage and current levels produced by a parametric measurement unit (PMU) 220 in the bipolar portion 242. The device 280 may then operate in conjunction with the DΣΔM circuitry 226 to control the DC levels, thereby ensuring that the PMU 220 produces highly stable DC voltage and current levels. A novel way of operating the device 280 in conjunction with the DΣΔM circuitry 226 is also described in detail below.

In another embodiment of the invention, shown in FIG. 2B, D-to-A converter channels 287a and 287b are included in the CMOS portion 240 instead of the DΣΔM circuitry 226 of FIG. 2A. This alternative way of using the digital signal processing device 280 to control the DC levels produced by the PMU 220 is also described in detail below in reference to FIGS. 2B and 3B.

The CMOS portion 240 may include circuitry (not shown) with sequential portions that can be synchronized with a clock (not shown) internal to the tester. For example, the timing generators 216, the DΣΔM circuitry 226, and the digital signal processing device 280 typically include circuitry (not shown) that can be synchronized with an internal test system clock. For this reason, this circuitry in the CMOS portion 240 of the pin slice circuit 214 is usually not seriously affected by variations in the timing characteristics of CMOS circuits. These timing characteristic variations may be caused by factors such as changes in the temperature of the pin slice circuit 214, or changes in the frequency of signals processed by the pin slice circuit 214.

However, the CMOS portion 240 may also include circuitry (not shown) that cannot be similarly synchronized with an internal test system clock. For example, the timing generators 216 are generally called upon to produce edges at times dictated by the timing of the DUT, not at times solely determined by the internal test system clock. For this reason, compensation techniques are preferably used in the timing generators 216 to improve the timing characteristics of the CMOS circuits. In this way, the timing generators 216, the DΣΔM circuitry 226, and the digital signal processing device 280 can reap the benefits of the reduced size, cost, and power of the CMOS portion 240 of the pin slice circuit 214, while not being seriously affected by variations in the timing characteristics of the CMOS portion 240.

The bipolar portion 242 of the pin slice circuit 214 includes a driver/receiver channel 218, a parametric measurement unit (PMU) 220, and preferably digital sigma delta decoder (DΣΔD) circuitry 228.

The edges produced by the timing generators 216 in the CMOS portion 240 are provided to the driver/receiver channel 218 in the bipolar portion 242. The driver/receiver channel 218 contains driver and comparator circuitry (not shown) necessary for generating and measuring digital signals and levels at a pin of the DUT 112.

Similarly, in the preferred embodiment of FIG. 2A, the data produced by the DΣΔM circuitry 226 in the CMOS portion 240 is provided to the DΣΔD circuitry 228 in the bipolar portion 242. As mentioned above, this data relates to the reference voltages used by the pin slice circuit 214.

Further, the data produced by the DΣΔM circuitry 226 is preferably in the form of a serial bit stream. This is because the CMOS and bipolar portions 240 and 242 of the pin slice circuit 214 are preferably implemented as custom IC's; and, we have recognized that the cost of custom IC's can be reduced by minimizing the number of pins on the IC's.

Accordingly, the DΣΔM circuitry 226 passes data to the DΣΔD circuitry 228 using a 1-bit wide line 244, thereby requiring only one output pad (not shown) on an IC implementing the CMOS portion 240 and only one input pad (not shown) on another IC implementing the bipolar portion.

The DΣΔD circuitry 228 provides multiple reference voltages to the driver/receiver channel 218 and the PMU 220 using the data provided by the DΣΔM circuitry 226 on the line 244. The driver/receiver channel 218 uses selected ones of these reference voltages as logical high levels and logical low levels when generating or measuring digital signals at a pin of the DUT 112.

The DΣΔD circuitry 228 provides multiple reference voltages, preferably twenty (20), to the driver/receiver channel 218. This is because the pin slice circuit 214 is typically implemented in a dual channel configuration with ten (10) reference voltages provided to each channel. Further, the pin slice circuit 214 is typically used for testing semiconductor devices implemented using different technologies, which may operate in accordance with different logic levels. The test system controller 110 sends control signals to the driver/receiver channel 218 indicating which reference voltages to use as logical high levels and logical low levels for the different DUT technologies.

The PMU 220 also uses selected ones of the reference voltages produced by the DΣΔD circuitry 228. Whereas the driver/receiver channel 218 uses the reference voltages for defining logical high and low levels for digital signals, the PMU 220 uses the reference voltages for producing and measuring DC levels at a pin of the DUT 112. The test system controller 110 also sends control signals to the PMU 220 indicating which reference voltages to use in producing and measuring the required DC levels.

Although FIGS. 2A and 2B show outputs of the driver/receiver channel 218 and the PMU 220 providing signals and levels to a pin of the DUT 112 using the same line, it should be understood that only one of them is active at a time and there is in fact no contention for the line. Accordingly, the test system controller 110 preferably controls switches or relays (not shown) for isolating the driver/receiver channel 218 and the PMU 220 from each other during a test.

The PMU 220 also provides indications of the DC levels it produces to the digital signal processing device 280 on lines 283 and 288. In particular, the lines 283 and 288 connect to inputs of the A-to-D channels 286a and 286b, respectively. The A-to-D channels 286a and 286b then convert the DC indications to digital form, thereby allowing the processor 284 to read in and monitor the DC voltage and current values. It is expected that 16-bit A-to-D converters (not shown), included in the A-to-D channels 286a and 286b (not shown), will provide sufficient resolution for the processor 284 to monitor the DC values.

Further, the processor 284 compares the monitored DC values with desired DC values, which may be stored in the memory 285. If the processor 284 recognizes that the monitored DC values do not match the desired DC values, then the processor 284 may perform corrective actions depending upon the chosen embodiment of the PMU 220. For example, the processor 284 may instruct the test system controller 110 to modify control signals provided to the DΣΔM circuitry 226, thereby adjusting selected ones of the reference voltages provided to the PMU 220. Alternatively, the processor 284 may directly control the DΣΔM circuitry 226 over a digital control bus 299. In the alternate embodiment of the invention of FIGS. 2B and 3B, the processor 284 may modify the levels of drive data provided to the PMU 220 by using the D-to-A channels 287a and 287b of FIG. 2B. These alternative ways of using the digital signal processing device 280 to control the DC levels produced by the PMU 220 will be described in more detail below with respect to FIGS. 3A through 3C.

Figure 3A:
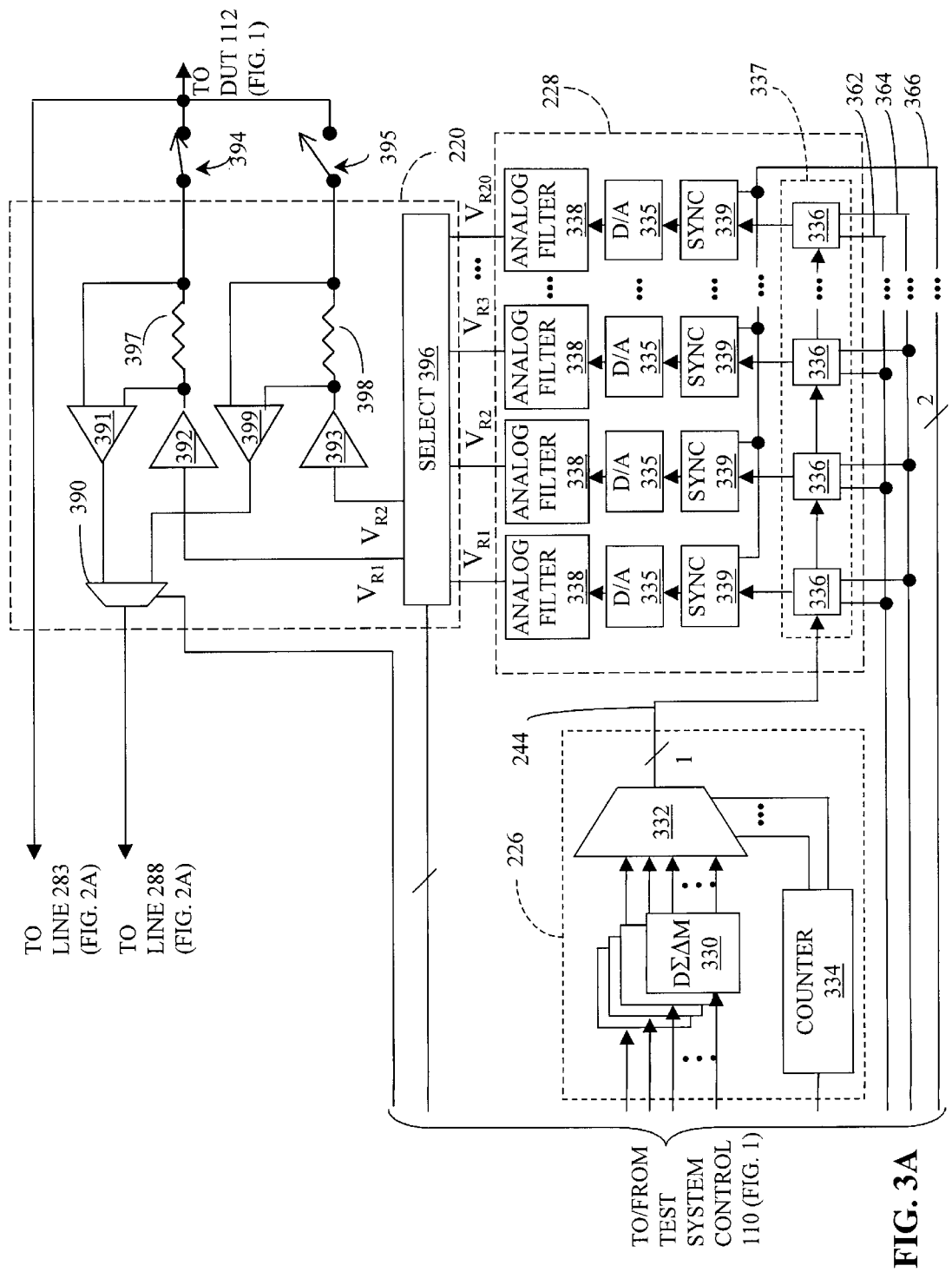
FIG. 3A is a detailed view of portions of the pin slice circuit shown in FIG. 2A.

FIG. 3A shows detailed views of the DΣΔM circuitry 226, the DΣΔD circuitry 228, and the PMU 220.

The DΣΔM circuitry 226 includes multiple DΣΔM's 330. As known to those skilled in this art, a DΣΔM is a simple, highly non-linear algorithm that can be implemented with digital circuitry and used to re-quantize high resolution digital input signals, thereby representing them as low resolution numbers at a higher sampling rate and with little loss of fidelity. One reason why DΣΔM's are used in the present invention is that they can be easily integrated with other circuits in the CMOS portion 240 of the pin slice circuit 214 using known techniques.

Low resolution, high-speed digital-to-analog (D-to-A) converters 335 (see FIG. 3A), such as 1-bit D-to-A converters, can then be used to recreate the multiple reference voltages used by the driver/receiver channel 218 and the PMU 220. These D-to-A converters can be easily fabricated in minimal area, even in a bipolar process. Accordingly, this low resolution representation of high resolution digital input signals leads to an area and cost efficient way of recreating the multiple, switched-analog, reference voltages in the bipolar portion 242 of the pin slice circuit 214.

In the illustrative embodiment shown in FIG. 3A, multiple DΣΔM's 330 are shown in the DΣΔM circuitry 226. This is because the PMU 220 is shown with driver circuitry 392 and 393 for providing DC levels to the DUT 112. The driver circuitry 392 provides DC levels to the DUT 112 that conform to a selected logical high voltage, $V_{R1}$. Similarly, the driver circuitry 393 provides DC levels to the DUT 112 that conform to a selected logical high threshold voltage, $V_{R2}$. Accordingly, the multiple DΣΔM's 330 are used to produce the reference voltages $V_{R1}$ and $V_{R2}$.

It should be understood that the number of DΣΔM's 330 in the DΣΔM circuitry 226 equals the number of reference voltages provided by the DΣΔD circuitry 228. Because the DΣΔD circuitry 228 provides twenty (20) reference voltages ($V_{R1}$ through $V_{R20}$) in the preferred embodiment, the DΣΔM circuitry 226 preferably includes twenty (20) DΣΔM's 330.

Each DΣΔM 330 accepts as its input a sequence of switched constant values provided by the test system controller 110. Each constant value corresponds with the desired DC level over some period of time at the reference voltage output $V_{R1}$, $V_{R2}$ ... or $V_{R20}$ associated with that modulator 330. Changing the constant value at the input of a DΣΔM 330 causes the numbers provided by the DΣΔM 330 to change. These numbers are then decoded, converted to analog levels, and filtered in the DΣΔD circuitry 228, thereby resulting in a new DC level at an output of the DΣΔD circuitry 228. Each output of the DΣΔD circuitry 228 is wired to an assigned voltage reference input at either the driver/receiver channel 218 or the PMU 220. In this way, the reference voltages can be specified by a tester operator during programming of the test system controller 110.

The sequence of constant values at the input of each DΣΔM 330 is then sampled and converted by the DΣΔM 330 using known techniques into an over-sampled, noise-shaped, pulse-density-modulated (ONPDM) output signal, which is preferably a 1-bit wide output stream at the frequency of the over-sampling clock (not shown). Generally, an ONPDM signal produced by a DΣΔM is characterized such that the average density of digital pulses in the ONPDM signal over a given period of time is equal to the mean value at the input of the DΣΔM over the same period of time. Accordingly, the DΣΔM's 330 produce ONPDM output signals with average pulse densities equal to the constant values at their inputs.

Further, each DΣΔM 330 samples the high resolution digital representation of the desired switched-analog reference voltage, and provides an over-sampled, noise-shaped, low resolution, digital bit stream at its output at a rate that is many times the Nyquist sampling frequency of the input signal. This is because most of the noise generated during the re-quantization will be contained in frequencies above the pass-band of analog low pass filters 338 (see FIG. 3A) as the output sample rate is increased. As more of the re-quantization noise power is spectrally shaped into high frequencies, less noise appears at the outputs of the analog low pass filters 338. This manner of generating a higher rate output data stream whose noise has been moved to a more desirable portion of the frequency spectrum is commonly known as "noise-shaped, over-sampling."

In the preferred embodiment, each DΣΔM 330 produces output samples at a sampling rate of 5 MHz, which allows the representation of signal frequencies up to a Nyquist limit of 2.5 MHz. If the analog low pass filters 338 are designed for a pass-band that rolls off steeply after 10 kHz, then the ratio of the over-sampled bandwidth to the analog output bandwidth will be 250 to 1, which is expected to be sufficient to provide analog output signals with the desired noise level.

As mentioned above, the cost of custom IC's can be reduced by minimizing the number of pins on the IC's. For this reason, the ONPDM outputs generated by the DΣΔM's 330 are provided to a multiplexor 332, which produces a time-multiplexed sequence of the outputs from the DΣΔM's 330 on the 1-bit wide line 244.

In particular, the DΣΔM's 330 preferably sample the values at their inputs synchronously. Consequently, bits in the output streams produced by respective DΣΔM's 330 are presented to the inputs of the multiplexor 332 in a synchronous manner. Further, the inputs of the multiplexor 332 are sequentially selected by a counter 334. In this way, the bits in the output streams produced by the DΣΔM's 330 are placed on the 1-bit wide line 244 in a sequential manner.

As mentioned above, the DΣΔM circuitry 226 preferably includes twenty (20) DΣΔM's 330. This means that the multiplexor 332 preferably has twenty (20) inputs for combining twenty (20) PDM outputs on the line 244. Further, the twenty (20) inputs of the multiplexor 332 are sequentially selected by the counter 334. In this way, bits in the output streams produced by the twenty (20) DΣΔM's 330 are placed on the line 244 in a sequential manner.

The test system controller 110 is programmed to control the DΣΔM's 330 and the counter 334 to ensure that the counter 334 counts through a complete cycle only when a new set of twenty (20) bits is available at the inputs of the multiplexor 332. Accordingly, the clock frequency of the counter 334 must be twenty (20) times the sampling rate of the DΣΔM's 330. Using the preferred sampling frequency of 5 MHz, this means that the clock frequency of the counter 334 is preferably 100 MHz.

The combined output stream on the line 244 is then provided to a shift register 337 included in the DΣΔD circuitry 228. The shift register 337 is used to segregate the output streams produced by the twenty (20) DΣΔM's 330 from the combined output stream on the line 244. Further, the test system controller 110 is programmed to control the application of a clock signal on line 362 and a sync signal on line 364 to the shift register 337.

In particular, the frequency of the clock signal applied to the shift register 337 on the line 362 must equal the clock frequency of the counter 334. For example, a 100 MHz clock applied to the counter 334 causes the multiplexor 332 to produce a bit stream on the line 244 at a frequency of 100 MHz. This means that the shift register 337 must also be clocked at a 100 MHz rate in order to shift twenty (20) bits at a time into twenty (20) registers 336. Further, whenever a new set of twenty (20) bits is available in the registers 336, outputs of the registers 336 are enabled and twenty (20) data pulses are simultaneously presented to twenty (20) identical synchronizing gates 339. In this way, each gate 339 is presented with a bit stream produced by a respective DΣΔM 330.

The test system controller 110 provides each gate 339 with a window signal on line 366. The window signal is preferably a differential signal for maximizing edge timing accuracy. For this reason, the line 366 is shown as a 2-bit wide line. Further, the window signal is used in conjunction with the gates 339 for controlling the width of the data pulses, and for ensuring that the data pulses in each stream are spaced far enough apart so that settling time does not affect the data pulse width.

Next, the gates 339 present the data streams to respective D-to-A converters 335. The D-to-A converters 335 convert the digital numbers to noisy versions of the desired DC levels. The analog outputs of the D-to-A converters 335 are then low pass filtered by the analog low pass filters 338, thereby removing most of the noise. It should be noted that the specific implementations of the low-resolution D-to-A converters 335 and the analog filters 338 are not critical to the invention.

The reference voltages $V_{R1}$ through $V_{R20}$ produced by the filters 338 are then provided to selection circuitry 396 included in the PMU 220. The test system controller 110 is programmed to control the selection circuitry 396, thereby presenting the proper reference voltages to the driver circuitry 392 and 393.

For example, the selection circuitry 350 is controlled to provide reference voltages $V_{R1}$ and $V_{R2}$ to the driver circuits 392 and 393, respectively, which produce DC voltage levels using drive data provided by the digital signal processing device 280 on lines 281 and 282. The DC voltage levels may be produced with values approaching $V_{R1}$ and $V_{R2}$ and then selectively passed through sense resisters 397 and 398, and switches 394 and 395, to the DUT 112.

In the preferred embodiment, the driver circuits 392 and 393 are the same as those used in the driver/receiver circuitry 218, thereby contributing to optimal efficiency in manufacturing cost. In this embodiment, $V_{ih}$ inputs on the drivers 392 and 393 are connected to selected reference voltages (such as $V_{R1}$ and $V_{R2}$ as shown), and $V_{il}$ inputs on the drivers 392 and 393 are connected to ground. This allows the drivers 392 and 393 to produce DC voltage levels within the ranges 0 to $V_{R1}$ volts, and 0 to $V_{R2}$ volts, respectively.

Further, the sense resistors 397 and 398 are preferably implemented on the IC implementing the bipolar portion 242, thereby minimizing the number of pins required on the bipolar IC and contributing to optimal efficiency in printed circuit board area and cost. However, the resistors 397 and 398 might alternatively be implemented "off-chip" as discrete resistors if the area available on the bipolar IC is restricted. In addition, the switches 394 and 395 are preferably implemented off-chip as relays or optically isolated FET's for minimizing noise.

Figure 3B:
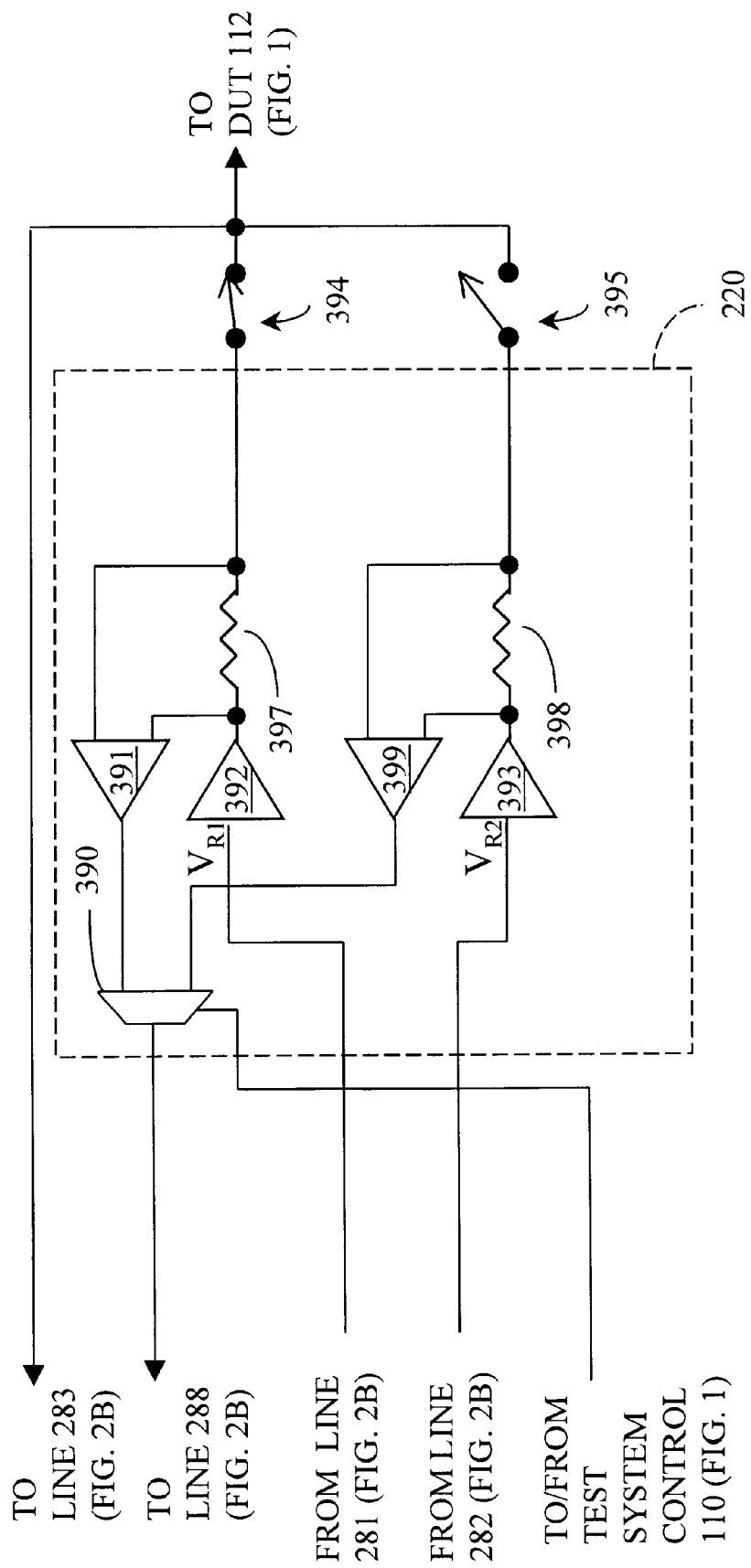
FIG. 3B is a detailed view of an alternative embodiment of parametric measurement circuitry included in the pin slice circuit shown in FIG. 2B.

In the alternate embodiment of FIGS. 2B and 3B, the digital signal processing device 280 may provide drive data to the driver circuits 392 and 393 through the D-to-A converters 287a and 287b. In this way, the device 280 can specify both the duration and the value of the DC levels produced by the drivers 392 and 393. In particular, the processor 284 may be programmed for sequentially providing specific values to the D-to-A channels 287a and 287b, which then convert the values to analog form and pass the converted values to the drivers 392 and 393 using the lines 281 and 282, respectively. It is expected that 16-bit D-to-A converters (not shown) included in the D-to-A channels 287a and 287b will provide sufficient resolution for the drive data provided by the digital signal processing device 280.

In both the embodiments of FIGS. 2A and 2B, in order to provide optimal flexibility in testing the DUT 112, the PMU 220 preferably includes a low current output section and a high current output section. To this end, the values of the sense resistors 397 and 398 are chosen to provide desired low and high DC current levels.

For example, the path including the driver 392 and the sense resistor 397 may be designed to provide a low DC current level. In this case, a suitable value for the sense resistor 397 may be 1 kΩ. Because the driver 392 has a defined gain, the value of the reference voltage, $V_{R1}$, may then be selected to provide a full-scale voltage output such as 2 volts. Accordingly, the corresponding full-scale current output would be equal to 2 mA. This means that the corresponding full-scale power level would be equal to 4 mW. Because the D-to-A channels 287a and 287b are preferably capable of converting 16-bit data, this also means that the corresponding LSB current output would be equal to 30 nA.

Further, the path including the driver 393 and the sense resistor 398 may be designed to provide a high DC current level. In this case, a suitable value for the sense resistor 398 may be 40 Ω. Because the drivers 392 and 393 preferably have the same defined gains, the value of the reference voltage, $V_{R2}$, may also be selected to provide a full-scale voltage output such as 2 volts. Accordingly, the corresponding full-scale current output would be equal to 50 mA. This means that the corresponding full-scale power level would be equal to 100 mW, and the corresponding LSB current output (assuming a 16-bit D-to-A converter) would be equal to about 0.8 μA.

Although specific values are described above for the sense resistors 397 and 398, it should be understood that other suitable values might also be used. For example, the values for the sense resistors 397 and 398 might be specified not only for satisfying the desired high and low DC current levels, but also for matching impedances of outputs of the pin slice circuit 214 and corresponding pins of the DUT 112.

The DC levels produced by the drivers 392 and 393 are then provided to the DUT 112 through the switches 394 and 395. The test system controller 110 is programmed to control the switches 394 and 395, thereby presenting a desired DC level to a pin (not shown) of the DUT 112.

It was mentioned that it is very important for pin slice circuits to generate stable DC voltage and current levels during parametric tests. This is because any instability in the generated DC levels may cause inaccuracies in test results. Such instability might be caused by factors such as process and temperature variations affecting the pin slice circuits. For this reason, the DC voltage level produced by either the driver 392 or 393 is provided to the digital signal processing device 280 on line 283. Accordingly, the test system controller 110 is programmed to actuate one of the switches 394 and 395, thereby presenting the DC voltage level produced by either the driver 392 or 393 to the A-to-D channel 286a.

Further, the PMU 220 includes differential amplifiers 391 and 399, which measure the voltage across the sense resistors 397 and 398, respectively, and present the measured voltages to a multiplexor 390. The test system controller 110 is programmed to emit a select signal to the multiplexor 390, thereby presenting the DC voltage level measured across either the sense resistor 397 or 398 to the A-to-D channel 286b on the line 288.

Because the sense resistors 397 and 398 have specified values, the DC current levels produced by the drivers 392 and 393 can be easily determined from the measured DC voltage levels.

The A-to-D channels 286a and 286b then convert the DC voltage levels on the lines 283 and 288, respectively, into digital form. Further, the processor 284 is programmed to read in the converted DC voltage levels and determine whether the drivers 392 and 393 are producing the desired DC voltage and current levels.

For example, FIG. 3A shows the case where the processor 284 monitors and controls DC levels produced by the driver 392. Accordingly, test system controller 110 emits a control signal to actuate the switch 394. Because only one of the DC levels produced by the drivers 392 and 393 may appear on the line 283 at one time, the switch 395 is shown in the "open" position. Consequently, the DC level produced by the driver 392 is provided to the A-to-D channel 286a on the line 283.

Further, the test system controller 110 emits a select signal to the multiplexor 390, thereby causing the level measured by the differential amplifier 391 to be placed on the line 288. Consequently, this measured level is provided to the A-to-D channel 286b on the line 288.

Next, the A-to-D channels 286a and 286b convert the DC levels into digital form and the processor 284 reads in the converted levels. The processor 284 can therefore either directly monitor the DC voltage level produced by the driver 392 on the line 283, or calculate the DC current level produced by the driver 392 using the measured voltage level on the line 288. The processor 284 then compares one or both of these levels with desired voltage and/or current levels, which are stored in the memory 285 at the start of the test session.

FIGS. 2A and 3A show the case where the processor 284 monitors and controls the DC levels produced by the driver 392. Again, the test system controller 110 is programmed to actuate the switch 394, open the switch 395, and emit a select signal to the multiplexor 390 that causes the output of the differential amplifier 391 to be placed on the line 288.

In this preferred embodiment, inputs of the drivers 392 and 393 are coupled to selected ones of the references voltages provided by the DΣΔD circuitry 228. For example, the input of the driver 392 may be coupled to the reference voltage, $V_{R1}$, and the input of the driver 393 may be coupled to the reference voltage, $V_{R2}$. Accordingly, if the processor 284 concludes that the DC levels produced by the drivers 392 and 393 do not match the desired levels, then the processor 284 adjusts the DC levels by changing the reference voltage levels $V_{R1}$ and $V_{R2}$. The processor 284 therefore directs the test system controller 110 to change, as appropriate, the sequences of switched constant values at the inputs of the modulators 330 associated with the reference voltages $V_{R1}$ and $V_{R2}$ until the desired levels are achieved. In this way, the digital signal processing device 280 ensures that the PMU 220 produces definite, stable DC voltage and current levels. Alternatively, the processor 284 could directly control the sequences of switched constant values described by the modulators 330 by issuing appropriate commands over the control bus 299.

It should be noted that the reference voltages $V_{R1}$ through $V_{R20}$ might be similarly provided to selection circuitry (not shown) included in the driver/receiver circuitry 218. The test system controller 110 would therefore be programmed to control this selection circuitry for presenting the proper reference voltages to drivers (not shown) and comparators (not shown) in the driver/receiver circuitry 218.

FIGS. 2B and 3B show an alternate embodiment of the invention where the digital signal processing device 280 provides drive data to the drivers 392 and 393 on the lines 281 and 282, respectively. Accordingly, if the processor 284 concludes based on the prior comparisons that the DC levels produced by the drivers 392 and 393 do not match the desired levels, then the processor 284 adjusts the DC levels by changing the magnitude of values it presents to the D-to-A channels 287a and 287b, thereby changing the levels of the drive data on the lines 281 and 282 until the desired levels are achieved.

Figure 3C:
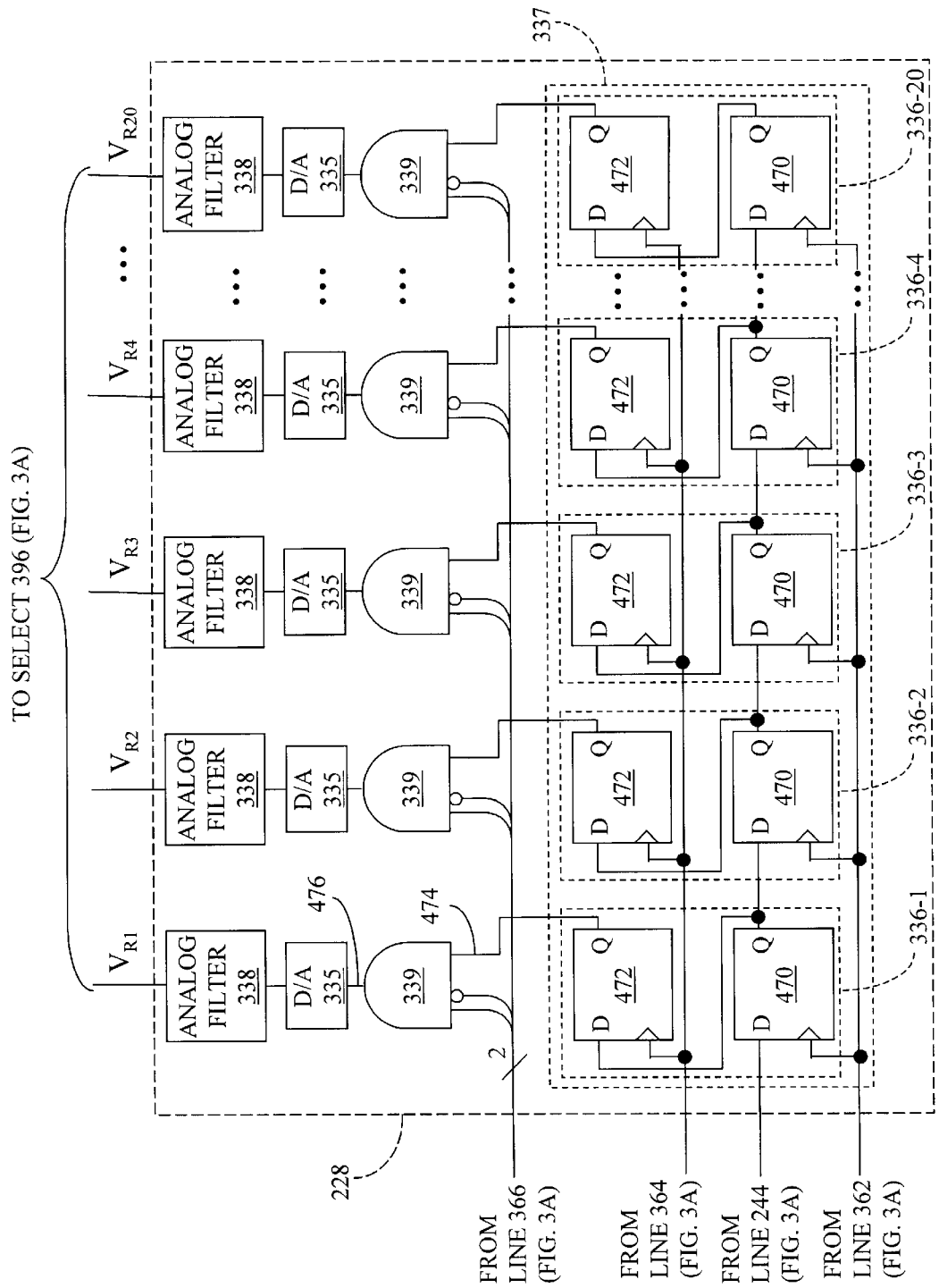
FIG. 3C is a schematic diagram of decoder circuitry included in the pin slice circuit shown in FIG. 3A.

FIG. 3C shows a schematic diagram of the DΣΔD circuitry 228. In particular, the 100 MHz bit stream produced by the multiplexor 332 is provided to the first register 336-1 in the shift register 337 on the line 244. Each of the registers 336-1 through 336-20 preferably include respective registers 470 and 472, which may be implemented using conventional D-flip-flops. Further, each of the respective registers 470 are serially connected as shown in FIG. 3C.

As mentioned above, the shift register 337 is preferably clocked at a 100 MHz rate in order to shift twenty (20) bits from the bit stream on the line 244 into the twenty (20) registers 336. Accordingly, the 100 MHz clock is provided to the respective registers 470 on the line 362. Further, whenever a new set of twenty (20) bits is available in the respective registers 470, the sync signal is applied on the line 364, thereby latching the twenty (20) bits in the respective registers 472. Because the sets of twenty (20) bits are preferably clocked into the registers 470 at a 100 MHz rate, the sync signal is applied to the line 364 at a 5 MHz rate.

Each set of bits latched in the registers 472 are then presented to the sync gates 339, which may be implemented using a conventional AND-gate configuration. The operation of the sync gates 339 may be described using the timing diagram shown in FIG. 4.

Figure 4:
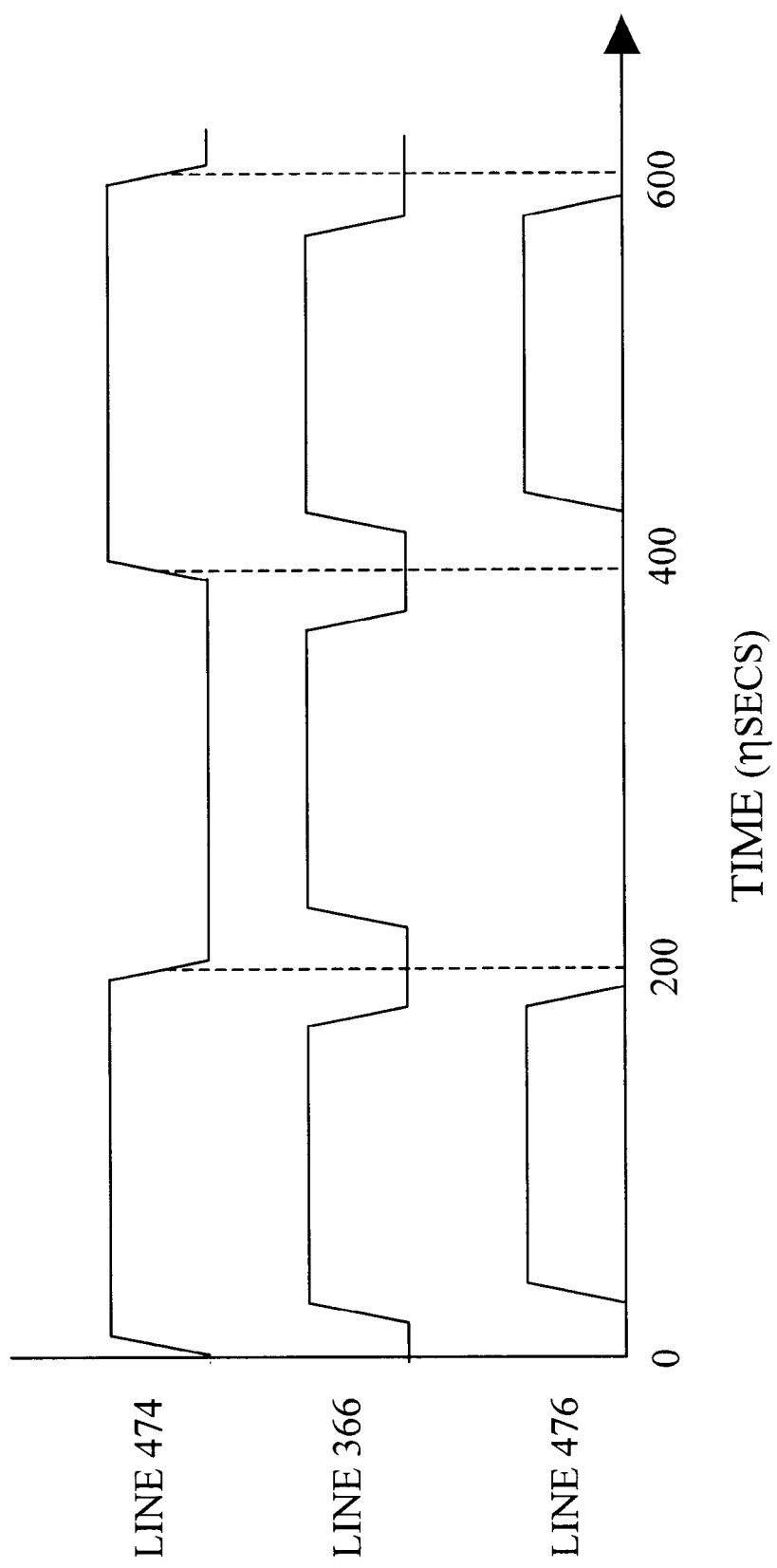
FIG. 4 is a timing diagram used to describe the operation of the decoder circuitry shown in FIG. 3C.

For example, FIG. 4 shows a series of data pulses on line 474 (FIG. 3C), which is connected to an input of one of the sync gates 339. The series of data pulses corresponds to a bit stream produced by one of the DΣΔM's 330. Further, because each DΣΔM 330 preferably samples the value at its input using a sampling frequency of 5 MHz, the width of each data pulse on the line 474 is 200 ηsecs. Accordingly, a data bit with a value of logical "1" occurs between times 1 and 200 ηsecs; a data bit with a value of logical "0" occurs between times 200 ηsecs and 400 ηsecs; and, a data bit with a value of logical "1" occurs between times 400 ηsecs and 600 ηsecs.

FIG. 4 also shows the window signal on the line 366. As mentioned above, the window signal is preferably a differential signal. Accordingly, FIG. 3A shows the line 366 as a 2-bit wide line connected to two inputs of each sync gate 339.

We have recognized that accuracy can be improved by precisely controlling the width and spacing of the data pulses provided by the registers 472. To this end, the sync gate 339 synchronizes the data on the line 474 with the window signal on the line 366. The synchronized data on the line 476 (FIG. 4) is then presented to the filter 338.

As shown in FIG. 4, the width of the data pulses on the line 476 equals the width of the pulses on the line 366; and, the minimum spacing between adjacent data pulses on the line 476 is equal to the spacing between the pulses on the line 366. Further, if the register 472 provides the sync gate 339 with a data bit having a value of logical "1," then the sync gate 339 provides a pulse with a fixed width to the filter 338. Alternatively, if the register 472 provides the sync gate 339 with a data bit having a value of logical "0," then the sync gate 339 sends no pulse to the filter 338. Finally, the filters 338 convert these data bit streams from PDM signals to PCM signals with constant values equal to the desired DC reference voltages $V_{R1}$ through $V_{R20}$.

Having described one embodiment, numerous alternative embodiments or variations might be made. For example, it was described that the pin slice circuit has a CMOS portion and a bipolar portion; and, that the timing generator and the DρΔ modulator circuitry are in the CMOS portion while the DΣΔ decoder circuitry, the driver/receiver channel, and the PMU are in the bipolar portion. However, this was merely an illustrative example. The pin slice circuit might be configured with different circuit blocks in the CMOS and bipolar portions.

For example, the DΣΔ decoder circuitry might be included in the CMOS portion. This would eliminate the need for combining multiple bit streams using a multiplexor and a counter, and then segregating the bit streams using a shift register. Further, this would require more pins in corresponding IC's for passing the reference voltages from the DΣΔ decoder circuitry in the CMOS IC to the driver/receiver channel and PMU in the bipolar IC, which could make the resulting system less cost and area efficient.

Further, the selection circuitry in the PMU 220 might be removed entirely and the reference voltages routed directly to the driver and differential amplifier circuitry.

In addition, in an alternative embodiment of the invention, the circuit including the differential amplifier 391, the sense resistor 397, the switch 394, and the driver 392 (see FIG. 3A) might be duplicated on the IC implementing the bipolar portion 242, with the exception that a larger value is used for the sense resistor. The output of the differential amplifier in this duplicated circuit would then be multiplexed with the outputs of the other differential amplifiers 391 and 399. Accordingly, an additional input and control line would be required for the multiplexor 390.

For example, the value of the sense resistor in the duplicated circuit might be equal to 25 kΩ while the value of the sense resistor 397 in the original circuit is equal to 1 kΩ. Such a larger sense resistor value would generally allow greater resolution for smaller current levels.

Further, the drivers in both the original circuit and the duplicated circuit may use the same reference voltage level (e.g., $V_{R1}$). This is because respective switches in the circuits, such as the switch 394, would be controlled so that only one of the circuits is used at a time. This embodiment would be especially useful if lower resolution D-to-A converters are incorporated into the invention.

In addition, the DΣΔ modulators described herein are preferably second-order modulators. However, higher-order modulators may be used for further reducing residual noise on the reference voltages after low pass filtering. Because higher order modulators generally require higher orders of analog filtering, the overall circuit complexity can be expected to increase, thereby reducing the area and cost efficiency.

Therefore, the invention should be limited only by the spirit and scope of the appended claims.

What is claimed is:

1. A semiconductor chip adapted for use in an automatic test system, comprising:

a modulation circuit, the modulation circuit having a control input and an output connected to an output pad of the semiconductor chip, the modulation circuit producing a stream of digital bits at its output for subsequent conversion into a first DC level, the stream of digital bits being representative of a value at the control input of the modulation circuit; and a programmable digital signal processing device for monitoring and controlling the first DC level, the digital signal processing device including an A-to-D channel connected to an input pad of the semiconductor chip, the A-to-D channel being used to convert a second DC level applied to the input pad into digital data, the second DC level being proportional to the first DC level, wherein the digital signal processing device is programmed for determining deviations of the digital data from desired data stored in memory and for controlling the value at the control input of the modulation circuit to minimize the deviations.

2. The semiconductor chip as recited in claim 1, wherein the chip is implemented using CMOS technology.

3. The semiconductor chip as recited in claim 1, further including a plurality of timing generator circuits, each timing generator circuit having a control input and an output having a signal thereon at a time determined by the value on the control input, and wherein the outputs of the timing generator circuits are coupled to output pads of the semiconductor chip.

4. The semiconductor chip as recited in claim 1, wherein the modulation circuit is a digital sigma delta modulator.

5. An automatic test system comprising the semiconductor chip as recited in claim 1, further including a second semiconductor chip comprising:

a parametric measurement unit formed thereon, the parametric measurement unit having a plurality of reference inputs, and an output coupled to the input pad of the semiconductor chip of claim 1 for applying the second DC level; and a conversion circuit having a digital input coupled to the output pad of the semiconductor chip of claim 1 and an analog output coupled to a reference input of the parametric measurement unit.

6. The automatic test system as recited in claim 5, wherein the semiconductor chip of claim 1 is implemented using CMOS technology, and the second semiconductor chip is implemented using bipolar technology.

7. The semiconductor chip as recited in claim 1, wherein the second DC level is proportional to current flowing out of or into a load connected to the first DC level.

8. A method of operating automatic test equipment of the type having a programmable digital signal processing device implemented on a first integrated circuit and parametric measurement circuitry implemented on a second integrated circuit, comprising the steps of:

(a) generating drive data using circuit means implemented on the first integrated circuit;

(b) providing the drive data to the second integrated circuit in a serial bit stream;

(c) generating a DC level proportional to the drive data using the parametric measurement circuitry;

(d) providing the DC level to the first integrated circuit;

(e) determining any deviation between the generated DC level and a desired DC level using the digital signal processing device; and (f) if a deviation is determined in step (e), modifying the drive data using the digital signal processing device to minimize the deviation.

9. The method as recited in claim 8, wherein the first integrated circuit is implemented in CMOS technology and the second integrated circuit is implemented in bipolar technology.

10. The method as recited in claim 9, wherein the step of providing the drive data includes providing the serial bit stream through a single pin of the first integrated circuit.

11. The method as recited in claim 10, further including steps of using circuit means on the second integrated circuit to segregate the serial bit stream into a plurality of segregated bit streams, and providing the segregated bit streams to the parametric measurement circuitry.

12. The method as recited in claim 10, wherein the step of providing the serial bit stream includes the steps of using a plurality of sigma delta modulators to generate a plurality of bit streams, each bit stream representing one reference level, and multiplexing the plurality of bits streams to form a single bit stream.

13. A process of manufacturing semiconductor chips using the method as recited in claim 8, the process comprising the steps of:

a) providing a wafer having a plurality of dies thereon;

b) testing the dies with a test system operated according to the method of claim 8 to identify functioning dies; and c) packaging the functioning dies.

14. A semiconductor chip adapted for use in an automatic test system, comprising:

a programmable digital signal processing device including at least one D-to-A channel and at least one A-to-D channel, an output of the D-to-A channel being connected to an output pad of the semiconductor chip, and an input of the A-to-D channel being connected to an input pad of the semiconductor chip, wherein the D-to-A channel converts digital data provided by the digital signal processing device into a first DC level at its output, the first DC level being subsequently provided by the test system to a device under test, wherein the A-to-D channel converts a second DC level at its input into corresponding digital data and provides the corresponding digital data to the digital signal processing device, the second DC level being proportional to the first DC level, and wherein the digital signal processing device is programmed for determining deviations of the digital data corresponding to the second DC level from desired data stored in memory and for controlling the digital data provided to the D-to-A channel to minimize the deviations.

15. The semiconductor chip as recited in claim 14, wherein the second DC level is proportional to current flowing out of or into a load connected to the first DC level.

16. The semiconductor chip as recited in claim 14, wherein the chip is implemented using CMOS technology.

17. The semiconductor chip as recited in claim 14, further including a plurality of timing generator circuits, each timing generator circuit having a control input and an output having a signal thereon at a time determined by the value on the control input, and wherein the outputs of the timing generator circuits are coupled to output pads of the semiconductor chip.

18. An automatic test system comprising the semiconductor chip as recited in claim 14,
further including a second semiconductor chip comprising:
  a parametric measurement unit formed thereon, the parametric measurement unit having a plurality of reference inputs and at least one output,
    wherein one of the reference inputs is coupled to the output pad of the semiconductor chip of claim 14, and
    wherein the output of the parametric measurement unit is coupled to the input pad of the semiconductor chip of claim 1 for applying the second DC level.

19. The automatic test system as recited in claim 18, wherein the semiconductor chip of claim 1 is implemented using CMOS technology, and the second semiconductor chip is implemented using bipolar technology.

* * * * *